(12) United States Patent
Yamazaki

(10) Patent No.: US 7,521,971 B2
(45) Date of Patent: Apr. 21, 2009

(54) BUFFER CIRCUIT

(75) Inventor: Yoshikazu Yamazaki, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/866,404

(22) Filed: Oct. 2, 2007

(65) Prior Publication Data

US 2008/0094126 A1 Apr. 24, 2008

(30) Foreign Application Priority Data

Oct. 20, 2006 (JP) ............... 2006-286263

(51) Int. Cl.
*H03B 1/00* (2006.01)
(52) U.S. Cl. .................... 327/112; 327/108
(58) Field of Classification Search ......... 327/108–112, 327/427
See application file for complete search history.

(56) References Cited

U.S. PATENT DOCUMENTS

| 5,606,281 A * | 2/1997 | Gloaguen | 330/51 |
| 5,959,475 A * | 9/1999 | Zomorrodi | 327/112 |
| 6,285,256 B1 * | 9/2001 | Wong | 330/255 |
| 7,106,136 B2 * | 9/2006 | Moon et al. | 330/261 |
| 7,271,630 B2 * | 9/2007 | Su | 327/112 |
| 7,348,848 B2 * | 3/2008 | Huang | 330/253 |
| 2005/0156668 A1 * | 7/2005 | Moon et al. | 330/261 |

FOREIGN PATENT DOCUMENTS

JP 2002-185269 A 6/2002

* cited by examiner

*Primary Examiner*—Lincoln Donovan
*Assistant Examiner*—Hai L. Nguyen
(74) *Attorney, Agent, or Firm*—Fitzpatrick, Cella, Harper & Scinto

(57) ABSTRACT

The present invention provides a buffer circuit meeting both of low power consumption requirement and an improvement in slew rate characteristics which are in a relation of trade off. Voltage difference detection circuits are provided for detecting a voltage difference between the input signal at rising and at trailing and an output signal. Based on the voltage difference, voltage-current conversion circuits increase a bias current to be supplied to an output NMOS transistor m1 and a source terminal of an output PMOS transistor constituting an output circuit. And, the voltage difference detection circuits have offset voltages. Only when the voltage difference changes into a level higher than the offset voltage, that is, when the input signal changes abruptly (rise or down), bias current increases.

2 Claims, 3 Drawing Sheets

BUFFER CIRCUIT

BACKGROUND OF THE INVENTION

1. Field of the Invention

The present invention relates to a buffer circuit and more specifically to a buffer circuit that can improve a slew rate characteristic under a low current consumption.

2. Description of the Related Art

In recent years, in an output buffer circuit used in various driver ICs and the like, a buffer circuit for satisfying characteristics in a trade-off relationship to each other, such as a large capacity driving power, a lower power consumption, and a high-speed output response has been needed.

As a conventional buffer circuit for outputting an input voltage, which is input into an input terminal, from an output terminal as an output voltage, a diamond-shaped buffer circuit, which is disclosed in Japanese Patent Application Laid-Open No. 2002-185269, has been known.

The above buffer circuit is formed by combination of source follower circuits of an output NMOS (N-channel MOS field-effect transistor) and a PMOS (P-channel MOS field-effect transistor). The diamond-shaped buffer circuit is a circuit that can operate at a high-speed with a low current consumption and simple circuitry.

As a buffer circuit for outputting a voltage signal to an output terminal by charging and discharging electricity for a load capacity connected with the output terminal according to a voltage signal input into an input terminal, a type of a buffer circuit using a differential amplifier has been known.

The above buffer circuit operates as it applies the voltage signal to a non-inverting input terminal of the differential amplifier, in which an inverting input terminal and the output terminal are directly connected with each other, and outputs the voltage signal from the output terminal of the differential amplifier to the output terminal.

As a buffer circuit that can operate at a high-speed with a low current consumption and simple circuitry, the diamond-shaped buffer circuit is advantageous.

If the above mentioned diamond-shaped buffer circuit has a big load capacity connected with the output terminal, the areas of the elements of an output NMOS and an output PMOS, which form an output part, need to be increased. If the areas are increased, gate terminal capacities of the output NMOS and the output PMOS are also increased.

Therefore, if current for driving the gate terminal capacity is small, the gate terminal voltage of the output NMOS and the gate terminal voltage of the output PMOS can neither charge nor discharge according to abrupt variation of the input voltage to the input terminal. That delays response, and accordingly, the response of the output voltage from the output terminal is delayed.

In order to make the output voltage from the output terminal respond rapidly to the input voltage to the input terminal, the current for driving the gate terminal capacities of the output NMOS and the output PMOS, which form the output part, needs to be increased. As the current steadily flows, however, it impedes lowering the consumption of the electricity.

As the lower power consumption and the high-speed output response are in trade-off relationship as mentioned above, it has been difficult to realize the buffer circuit that satisfies both of the characteristics.

SUMMARY OF THE INVENTION

The present invention intends to provide a buffer circuit that can satisfy characteristics in a trade-off relationship to each other such as a large capacity driving power, a lower power consumption, and a high-speed output response.

A buffer circuit of the present invention is a buffer circuit having an input terminal for inputting an input signal, and an output terminal for outputting an output signal based on the input signal including: an output circuit having first and second output transistors for outputting the output signal from the output terminal; a first voltage difference detection circuit for detecting a voltage difference between the input signal and the output signal; a second voltage difference detection circuit for detecting a voltage difference between the input signal and the output signal; a first driving circuit for increasing a bias current to be supplied to the first transistor based on an output signal from the first voltage difference detection circuit; and a second driving circuit for increasing a bias current to be supplied to the second transistor based on an output signal from the second voltage difference detection circuit.

According to the present invention, a buffer circuit, which satisfies both of lowering power consumption and a slew rate characteristic in a trade-off relationship to each other, can be realized.

Further features of the present invention will become apparent from the following description of exemplary embodiments with reference to the attached drawings.

DESCRIPTION OF THE EMBODIMENTS

Now, exemplary embodiments for implementing the present invention will be described in detail with reference to the drawings.

First Embodiment

Figure 1:
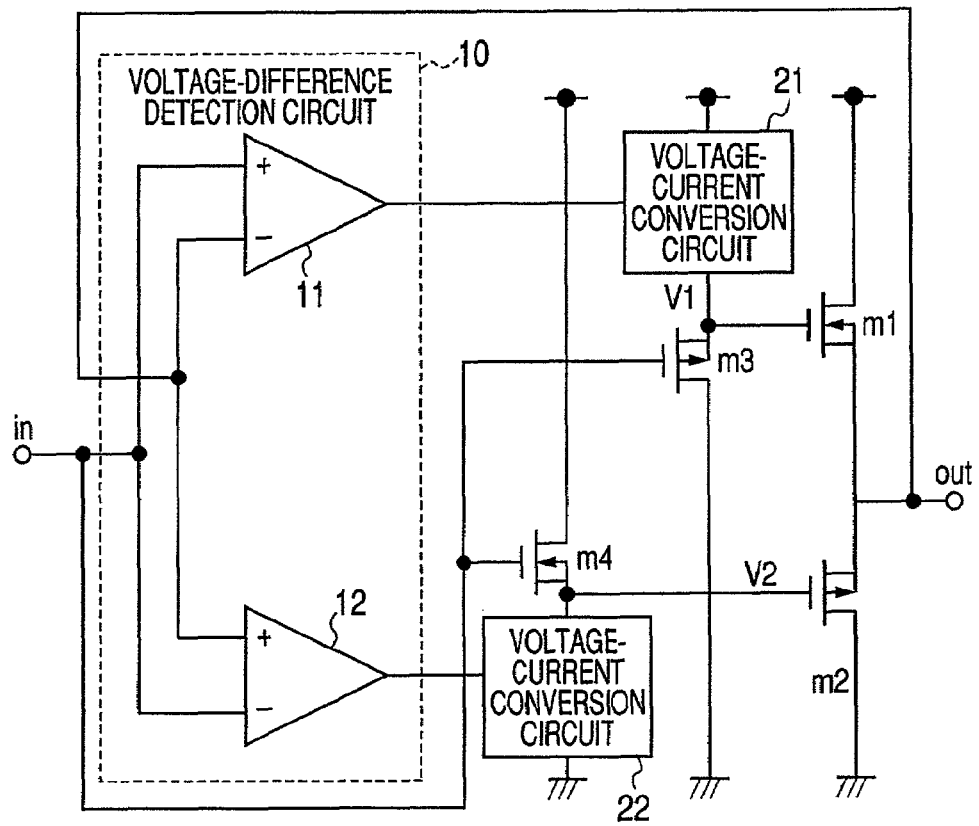
FIG. 1 is a circuit diagram illustrating a first embodiment of a buffer circuit according to the present invention.

FIG. 1 is a circuit diagram showing configuration of a first embodiment of a buffer circuit according to the present invention. The circuit shown in FIG. 1 is a buffer circuit for outputting an input voltage input into an input terminal 'in' from an output terminal 'out' as an output voltage.

To the output terminal 'out' of the buffer circuit, a source terminal of an output NMOS transistor m1 and a source terminal of an output PMOS transistor m2 are connected, forming a push-pull type output circuit. In the description below, each of the MOS transistors is simply referred to as the NMOS or the PMOS for simplicity.

A drain terminal of an output NMOS m1 forming the output circuit is connected with a power source. Gate terminals are connected with a voltage-current conversion circuit 21 which supplies current from the power source and a source terminal of a PMOS m3. A drain terminal of PMOS m3 is connected with a reference potential and a gate terminal is connected with the input terminal 'in', respectively. In the embodiment, operations for raising the output voltage to be output from the output terminal 'out' in response to raising of the input voltage input into the input terminal 'in' by operations of the voltage-current conversion circuit 21 and the like are performed as described later.

A drain terminal of an output PMOS m2 that forms the other output circuit is connected with a reference potential and gate terminals are connected with a voltage-current conversion circuit 22 which supplies current to the reference potential and a source terminal of an NMOS m4. A drain terminal of an NMOS m4 is connected with a power source and a gate terminal is connected with the input terminal 'in', respectively. In the embodiment, operations for lowering the output voltage to be output from the output terminal 'out' in response to lowering of the input voltage input into the input terminal 'in' by operations of the voltage-current conversion circuit 22 and the like are performed as described later.

A voltage difference detection circuit 10, with which the input terminal 'in' and the output terminal 'out' are connected, is provided. The voltage difference detection circuit 10 detects a voltage difference between an input voltage Vin of the input terminal 'in' and an output voltage Vout of the output terminal 'out'.

The voltage difference detection circuit 10 includes a differential amplifier circuit 11 and a differential amplifier circuit 12. As shown in FIG. 1, the differential amplifier circuit 11 inputs the input signal and the output signal in a polarity opposite to a polarity of the input signal and the output signal which the differential amplifier circuit 12 inputs. Output from the differential amplifier circuit 11 is connected with the voltage-current conversion circuit 21, and output from the differential amplifier circuit 12 is connected with the voltage-current conversion circuit 22.

Now, operations of the voltage difference detection circuit 10, the voltage-current conversion circuit 21 and the voltage-current conversion circuit 22 of the buffer circuit shown in FIG. 1 will be described with reference to a graph shown in FIG. 2.

The voltage difference detection circuit 10 detects a voltage difference Vin−Vout between an input voltage Vin of the input terminal 'in' and an output voltage Vout of the output terminal 'out', and outputs voltages according to voltage values of the voltage difference Vin−Vout from the differential amplifier circuit 11 and the differential amplifier circuit 12, respectively.

The voltage-current conversion circuit 21 and the voltage-current conversion circuit 22 operate so that the current changes according to output voltages from the differential amplifier circuit 11 and the differential amplifier circuit 12 to change a bias current through a push part and a pull part. The push part refers to the output NMOS m1 forming an output circuit, and the pull part refers to the output PMOS m2.

Specifically, when the input voltage Vin of the input terminal 'in' is higher than the output voltage Vout from the output terminal 'out', the output voltage from the differential amplifier circuit 11 transits to cause the voltage-current conversion circuit 21 to increase the bias current through the push part.

When the input voltage Vin of the input terminal 'in' is lower than the output voltage Vout from the output terminal 'out', the output voltage from the differential amplifier circuit 12 transits to cause the voltage-current conversion circuit 22 to increase the bias current through the pull part.

As such, the voltage-current conversion circuit 21 functions as a driving circuit for changing the bias current through the push part according to the output voltage from the differential amplifier circuit 11. Similarly, the voltage-current conversion circuit 22 functions as a driving circuit for changing the bias current through the pull part according to the output voltage of the differential amplifier circuit 12.

The differential amplifier circuit 11 and the differential amplifier circuit 12 with a predetermined offset voltage ΔV works to lowering the power consumption. FIG. 2 shows characteristics of bias current value i1 through the push part and the bias current value i2 through the pull part for the absolute value |Vin−Vout| of a voltage difference between the input voltage Vin and the output voltage Vout.

Specifically, the differential amplifier circuit 11 and the differential amplifier circuit 12 having the predetermined offset voltage ΔV have a characteristic that increasing of the bias current value is linear to |Vin−Vout|, and show characteristic of the bias current value i1 of the push part and the bias current value i2 of the pull part for the voltage value of |Vin−Vout|.

Figure 2:
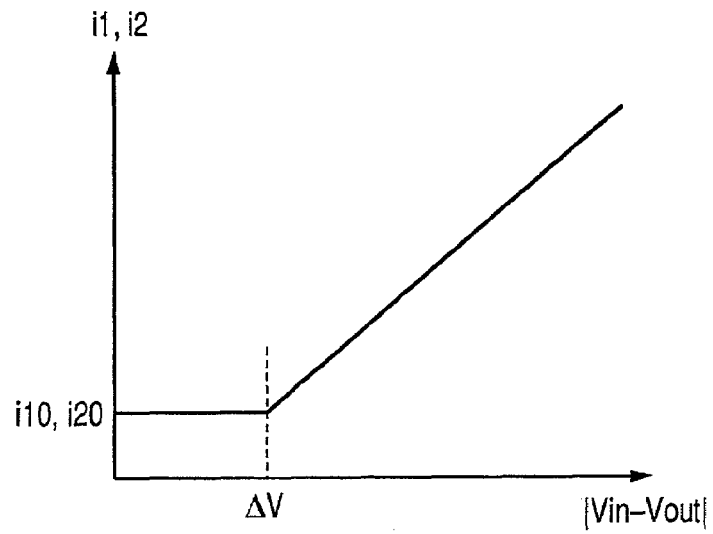
FIG. 2 is a diagram for describing operations of the differential amplifier circuit and the voltage-current conversion circuit shown in FIG. 1.

As shown in FIG. 2, when the absolute value |Vin−Vout| of a differential voltage is at the predetermined offset voltage ΔV of the differential amplifier circuit 11 and the differential amplifier circuit 12 or less, it has a characteristic to be the bias current values i10 and i20 each of which is an initial value. When the absolute value |Vin−Vout| of the differential voltage is at the offset voltage ΔV or more, the bias current value has a characteristic to lineally increase from the bias current values i10 and i20, each of which is an initial value, according to the differential voltage value.

Now, the operations of the buffer circuit shown in FIG. 1 will be described with reference to the timing-chart shown in FIG. 3. When the input voltage Vin of the input terminal 'in' is in an equilibrium state, the output voltage Vout from the output terminal 'out' has about the same potential as that of the input voltage Vin of the input terminal 'in'. Here, a voltage difference Vin−Vout between the input voltage Vin of the input terminal 'in' and the output voltage Vout from the output terminal 'out' is almost zero.

In such a case, as the voltage difference is at the predetermined offset voltage ΔV of the differential amplifier circuit 11 and the differential amplifier circuit 12 or less, bias current sources i1 and i2 decided by the differential amplifier circuits 11 and 12 indicate the bias current values i10 and i20 each of which is an initial value.

Figure 3:
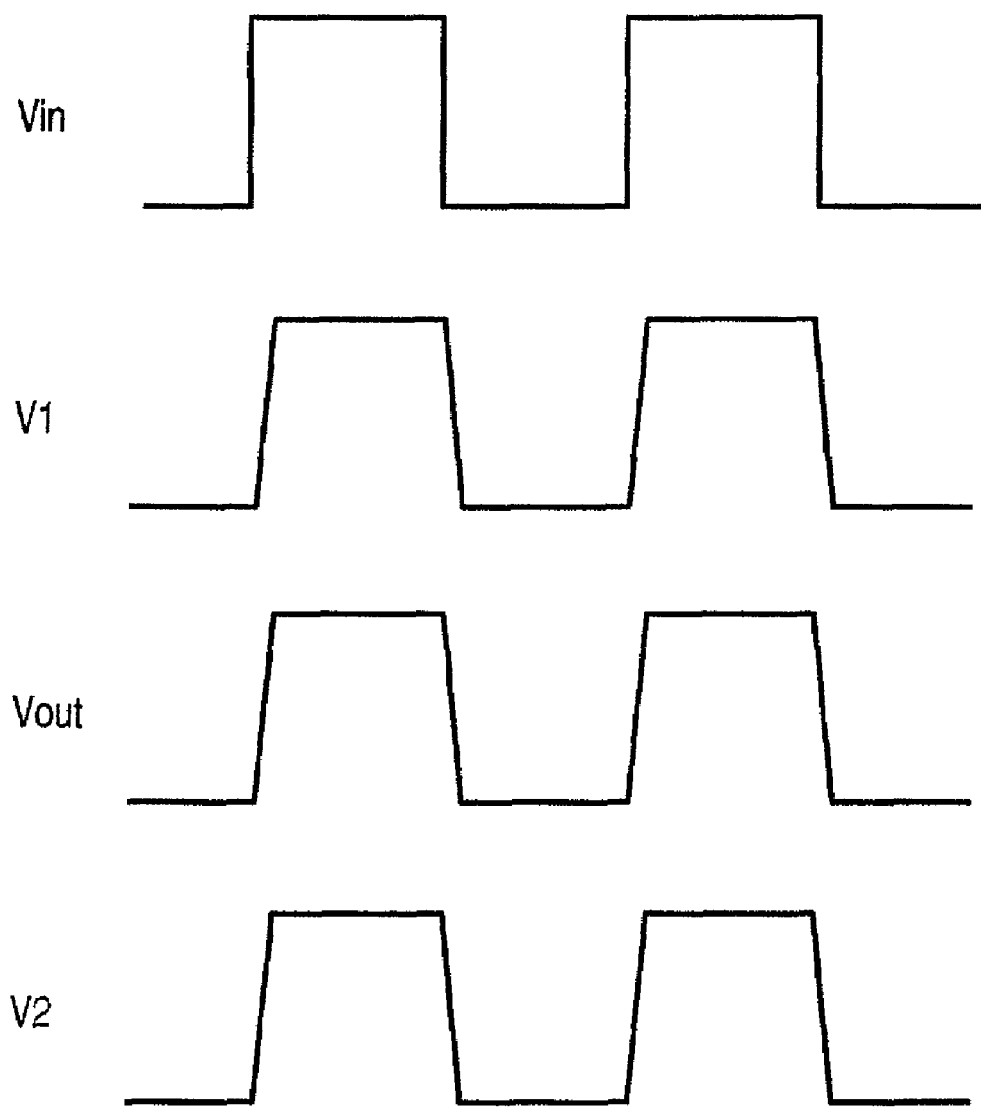
FIG. 3 is a timing-chart for describing operations of the buffer circuit shown in FIG. 1.

Here, when the input voltage Vin rises forming a rectangular shape as shown in FIG. 3, the output voltage Vout from the output terminal 'out' is still the voltage value immediately before. Thus, the voltage difference Vin−Vout between the input voltage Vin of the input terminal 'in' and the output voltage Vout from the output terminal 'out' increases to the predetermined offset voltage ΔV of the differential amplifier circuit 11 or more.

Accordingly, the bias current value i1 at the push part increases from the bias current value i10, which is an initial value, according to the voltage difference Vin−Vout to be able to rapidly charge the gate terminal capacity of the output NMOS m1. Therefore, the gate terminal voltage V1 of the output NMOS m1 can transit following even abrupt variation of the input voltage Vin of the input terminal 'in'. As a result, the output voltage Vout from the output terminal 'out' can be raised at a high-speed.

When the input voltage Vin falls forming a rectangular shape as shown in FIG. 3, the output voltage Vout from the output terminal 'out' is still the voltage value immediately before. Thus, the absolute value |Vin−Vout| of a differential voltage between the input voltage Vin of the input terminal 'in' and the output voltage Vout from the output terminal 'out' increases to the predetermined offset voltage ΔV of the differential amplifier circuit 12 or more.

Accordingly, the bias current value i2 at the pull part increases from the bias current value i20, which is an initial value, according to the absolute value |Vin−Vout| of the differential voltage to be able to rapidly discharge the gate terminal capacity of the output PMOS m2. Therefore, the gate terminal voltage V2 of the output PMOS m2 can transit following even abrupt variation of the input voltage Vin of the input terminal 'in'. As a result, the output voltage Vout from the output terminal 'out' can be raised at a high-speed.

In the embodiment, the voltage difference detection circuit 10 with the input voltage Vin of the input terminal 'in' and the output voltage Vout from the output terminal 'out' used as input is provided. The voltage difference detection circuit 10 is formed by the differential amplifier circuits 11 and 12 each of which has a predetermined offset voltage. The embodiment is adapted to cause the voltage difference detection circuit 10 to change bias current values at the push part and the pull part by the voltage-current conversion circuits 21, 22, into which output signals from the differential amplifier circuits 11, 12 are input.

Only when a big voltage difference is generated between the input voltage Vin of the input terminal 'in' and the output voltage Vout from the output terminal 'out', i.e., only when the input voltage Vin of the input terminal 'in' abruptly transits, the bias current values at the push part and the pull part increase. With such configuration, the high-speed response is enabled so that the slew rate characteristic can be improved.

In the case of the equilibrium state in which the voltage difference is not formed between the input voltage Vin of the input terminal 'in' and the output voltage Vout from the output terminal 'out', the bias current values at the push part and the pull part can be minimized. As a result, the current consumption can be lowered. Therefore, the embodiment can satisfy both of lowering power consumption and slew rate characteristic in a trade-off relationship to each other required to a buffer circuit.

The embodiment provides predetermined offset voltages to the differential amplifier circuits 11, 12 with the input voltage Vin of the input terminal 'in' and the output voltage Vout from the output terminal 'out' as input. That is for the purpose of lowering the current consumption. If a buffer circuit that puts much weight on the slew rate characteristic is desired, it is effective to reduce the offset voltages of the differential amplifier circuits 11, 12 to zero.

The embodiment provides a characteristic that the bias current value linearly increases to the absolute value |Vin−Vout| of the differential voltage between the input voltage Vin of the input terminal 'in' and the output voltage Vout from the output terminal 'out' as shown in FIG. 2.

The present invention is effective in improving the slew rate characteristic if only the bias current value at the push part and the pull part increases as the absolute value |Vin−Vout| of the voltage difference increases without requiring the linear characteristic.

Although the buffer circuit is formed by a MOS field-effect transistor in the embodiment, the present invention is not limited to such circuitry with only the MOS field-effect transistor. For example, the circuit may be formed either by a bipolar transistor or by combination of the MOS field-effect transistor and the bipolar transistor.

Second Embodiment

Figure 4:
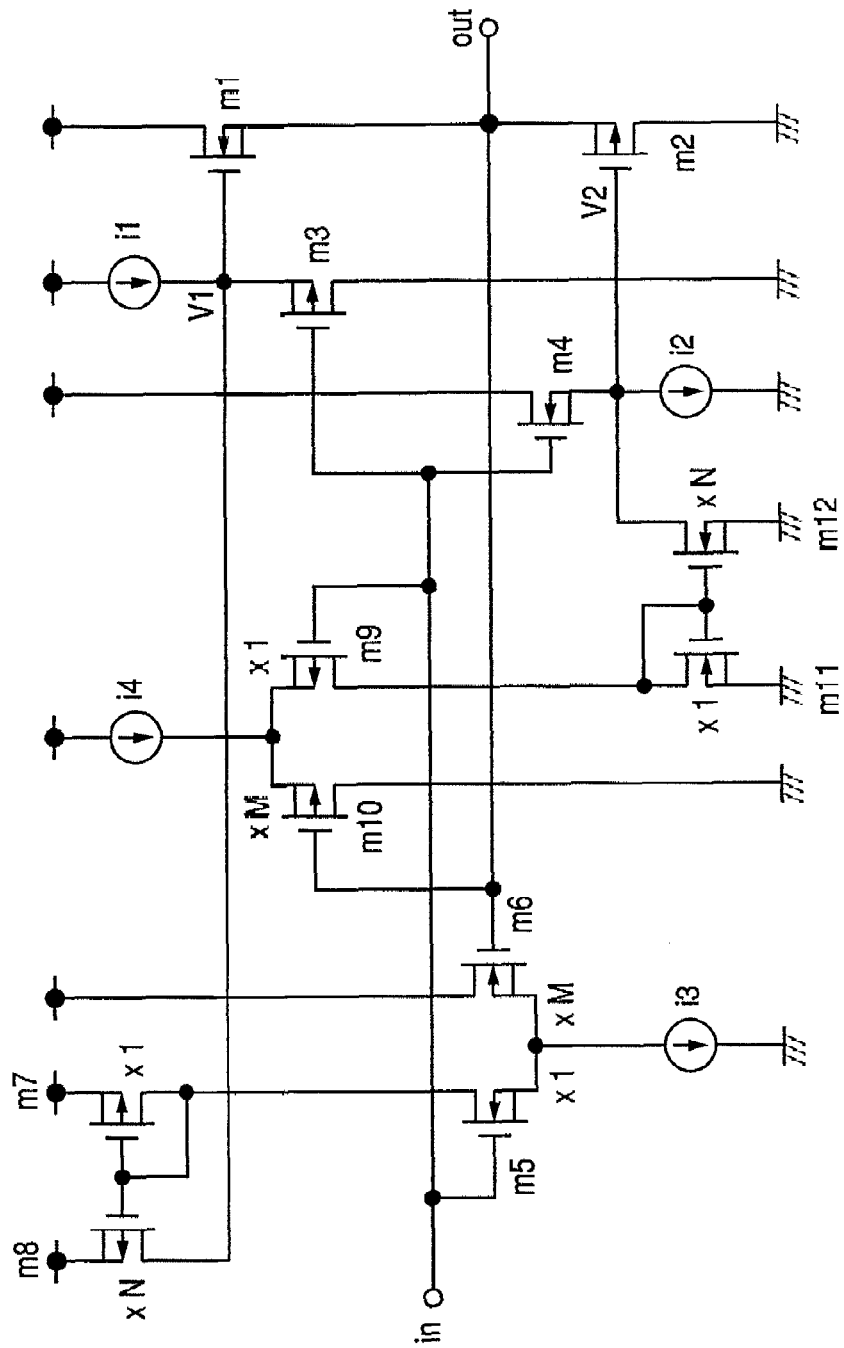
FIG. 4 is a circuit diagram illustrating a second embodiment of the present invention.

FIG. 4 is a circuit diagram showing the second embodiment of the buffer circuit of the present invention. In FIG. 4, the same parts as those in FIG. 1 are numbered the same. A circuit including an NMOS m5, NMOS m6 and a current source i3 shown in FIG. 4 corresponds to the differential amplifier circuit 11 shown in FIG. 1. A circuit including a PMOS m9, a PMOS m10 and a current source i4 corresponds to the differential amplifier circuit 12. The differential amplifier circuits are assumed to have the predetermined input offset voltage as shown in FIG. 1.

A circuit including a PMOS m7, a PMOS m8 and a constant current source i1 shown in FIG. 4 corresponds to the voltage-current conversion circuit 21 shown in FIG. 1. A circuit including an NMOS m11, an NMOS m12 and a constant current source i2 corresponds to the voltage-current conversion circuit 22. The embodiment, however, shows an example of supplying a predetermined bias current instead of characteristic that the bias current lineally changes against the differential voltage as shown in FIG. 2, as described later.

As described with reference to FIG. 1, the circuit shown in FIG. 4 is a buffer circuit for outputting the input voltage input in the input terminal 'in' from the output terminal 'out' as an output voltage. To the output terminal 'out', a source terminal of the output NMOS m1 and a source terminal of the output PMOS m2 are connected, forming a push-pull type output circuit.

A drain terminal of the output NMOS m1 is connected with the power source. A gate terminal is connected with the current source i1 for supplying current from the power source, which is one of bias current sources, and the drain terminal of the PMOS m8 that forms a current mirror circuit. A gate terminal of the output NMOS m1 is connected with a source terminal of the PMOS m3.

A drain terminal of PMOS m3 is connected with a reference potential and a gate terminal is connected with the input terminal 'in', respectively. In the embodiment, operations for raising the output voltage to be output from the output terminal 'out' in response to raising of the input voltage input into the input terminal 'in' are similarly performed.

A drain terminal of an output PMOS m2 is connected with a reference potential and gate terminals are connected with the current source i2 for supplying current to the reference potential, which is one of the bias current sources, and a drain terminal of the NMOS m12 forming the current mirror circuit. A gate terminal of the output PMOS m2 is connected with a source terminal of the NMOS m4.

The drain terminal of the NMOS m4 is connected with the power source and the gate terminal is connected with the input terminal 'in', respectively. In the embodiment, operations for lowering the output voltage to be output from the output terminal in response to lowering of the input voltage input into the input terminal are similarly performed.

The input terminal 'in' is connected with the gate terminal of the NMOS m5 that forms the differential amplifier circuit 11, and the output terminal 'out' is connected with the gate terminal of the NMOS m6, which is formed as an element, by connecting M elements the same as those in the NMOS m5 in parallel. Source terminals of the NMOS m5 and the NMOS m6 are connected with a bias current source i3 for supplying current to the reference potential, and a drain terminal of the NMOS m6 is connected with the power source.

A drain terminal of the NMOS m5 is connected with a drain terminal and a gate terminal of the PMOS m7 that forms the current mirror circuit. A source terminal of the PMOS m7 is connected with the power source, and a gate terminal of the PMOS m7 is connected with the gate terminal of the PMOS m8, which is formed as an element, by connecting N elements the same as those in the PMOS m7 in parallel.

A source terminal of the PMOS m8 is connected with the power source, and a drain terminal of the PMOS m8 is connected with the gate terminal of the output NMOS m1 and the bias current source i1 and the source terminal of the PMOS m3, respectively.

The PMOS m7 and the PMOS m8 that form the current mirror circuit function as the bias current source (driving circuit) that increases and supplies the bias current to the output NMOS m1 when the voltage difference between the input voltage Vin and the output voltage Vout is at a predetermined offset voltage or more.

The input terminal 'in' is connected with a gate terminal of the PMOS m9 that forms the differential amplifier circuit 12, and the output terminal 'out' is connected with a gate terminal of the PMOS m10 that is formed as an element by connecting M elements the same as those in the PMOS m9 in parallel. Source terminals of the PMOS m9 and the PMOS m10 are connected with a bias current source i4 that supplies the current from the power source, and a drain terminal of the PMOS m10 is connected with a reference potential.

A drain terminal of the PMOS m9 is connected with the drain terminal and the gate terminal of the NMOS m11 that forms the current mirror circuit. A source terminal of the NMOS m11 is connected with the reference potential, and the gate terminal of the NMOS m11 is connected with a gate terminal of the NMOS m12 that is formed as an element by connecting N elements the same as those in the NMOS m11 in parallel.

A source terminal of the NMOS m12 is connected with the reference potential, and a drain terminal of the NMOS m12 is connected with the gate terminal of the output PMOS m2 and the current source i2 and the source terminal of the NMOS m4, respectively.

The NMOS m11 and the NMOS m12 that form the current mirror circuit function as a bias current source (driving circuit) that increases and supplies the bias current to the output PMOS m2 when the voltage difference between the input voltage Vin and the output voltage Vout is at a predetermined offset voltage or more.

Now, operations of the buffer circuit shown in FIG. 4 will be described with reference to the timing-chart shown in FIG. 3. When the input voltage Vin of the input terminal 'in' is in an equilibrium state, the output voltage Vout from the output terminal 'out' has about the same potential as that of the input voltage Vin of the input terminal 'in'. Therefore, a voltage difference Vin–Vout between the input voltage Vin of the input terminal 'in' and the output voltage Vout from the output terminal 'out' is almost zero.

Here, the ratio of the numbers of elements in the NMOS m5 and the NMOS m6, which are input of the differential amplifier circuit 11, is 1:M. Therefore, when the input voltage Vin of the input terminal 'in' and the output voltage Vout from the output terminal 'out', which are the same potential, are input into respective gate terminals, each pair of differentials enters in a non-equilibrium state. That is, the current through the bias current source i3 is supplied from the NMOS m6 side and the current toward the NMOS m5 side does not flow.

Therefore, as current does not flow toward the PMOS m7 side in the current mirror circuit that is formed by the PMOS m7 and the PMOS m8, the bias current to be additionally supplied from the PMOS m8 to the push part becomes zero.

Similarly, the ratio of the numbers of elements in the PMOS m9 and the PMOS m10, which are input of the differential amplifier circuit 12, is 1:M. Therefore, when the input voltage Vin of the input terminal 'in' and the output voltage Vout from the output terminal 'out', which are the same potential, are input into respective gate terminals, each pair of differentials enters in a non-equilibrium state. That is, the current through the bias current source i4 is supplied into the PMOS m10 side and the current toward the PMOS m9 side does not flow.

Therefore, as current does not flow toward the NMOS m11 side in the current mirror circuit that is formed by the NMOS m11 and the NMOS m12, the bias current to be additionally supplied from the NMOS m12 to the pull part becomes zero.

Here, when the input voltage Vin rises forming a rectangular shape as shown in FIG. 3, the output voltage Vout from the output terminal 'out' is still the voltage value immediately before. Thus, the voltage difference Vin–Vout between the input voltage Vin of the input terminal 'in' and the output voltage Vout from the output terminal 'out' increases. Accordingly, the voltage difference Vin–Vout becomes the predetermined offset voltage or more, where the offset voltage is set by the number of elements of the NMOS m5 and NMOS m6 that are input of the differential amplifier circuit 11.

When the voltage difference is big, i.e., when the input voltage Vin abruptly changes, the pair of differentials enters into a non-equilibrium state, which is reverse to the equilibrium state, and the current through the bias current source i3 flows toward the NMOS m5 side. The current is amplified by a factor of N in the current mirror circuit, which is formed by the PMOS m7 and the PMOS m8. The bias current to be additionally supplied from the PMOS m8 to the push part becomes (i3×N).

Therefore, the bias current for charging the gate terminal capacity of the output NMOS m1 becomes (i1+i3×N), being able to rapidly charge the gate terminal capacity. Accordingly, the gate terminal voltage V1 of the output NMOS m1 can transit according to abrupt transit of the input voltage Vin of the input terminal 'in'. As a result, the output voltage Vout from the output terminal 'out' can be rapidly raised.

When the input voltage Vin falls forming a rectangular shape as shown in FIG. 3, the output voltage Vout from the output terminal 'out' is still the voltage value immediately before. Thus, the absolute value |Vin–Vout| of the voltage difference between the input voltage Vin of the input terminal 'in' and the output voltage Vout from the output terminal 'out' increases. Accordingly, the absolute value |Vin–Vout| of the voltage difference becomes the predetermined offset voltage or more, where the offset voltage is set by the number of elements of the PMOS m9 and PMOS m10 that are input of the differential amplifier circuit 12.

When the voltage difference is big, i.e., when the input voltage Vin abruptly changes, the pair of differentials enters into a non-equilibrium state, which is reverse to the equilibrium state, and the current through the bias current source i4 flows toward the PMOS m9 side. The current is amplified by a factor of N in the current mirror circuit, which is formed by the NMOS m11 and the NMOS m12. The bias current to be additionally supplied from the NMOS m12 to the pull part becomes (i4×N).

Therefore, the bias current for discharging the gate terminal capacity of the output PMOS m2 becomes (i2+i4×N), being able to rapidly discharge the gate terminal capacity. Accordingly, the gate terminal voltage V2 of the output PMOS m2 can transit according to abrupt transit of the input voltage Vin of the input terminal 'in'. As a result, the output voltage Vout from the output terminal 'out' can be rapidly fallen.

In the embodiment, the voltage difference detection circuit with a predetermined offset voltage, which uses the input voltage Vin of the input terminal 'in' and the output voltage Vout from the output terminal 'out' as input is provided. The embodiment is adapted to additionally supply bias current to the bias current values at the push part and the pull part according to output from the differential amplifier circuit.

Therefore, only when a big voltage difference is generated between the input voltage Vin of the input terminal 'in' and the output voltage Vout from the output terminal 'out', i.e., only when the input voltage Vin of the input terminal 'in' abruptly transits, the bias current values at the push part and the pull part increase. With such configuration, the high-speed response is enabled so that the slew rate characteristic can be improved.

In the case of the equilibrium state in which the voltage difference is not formed between the input voltage Vin of the input terminal 'in' and the output voltage Vout from the output terminal 'out', bias current cannot be additionally supplied to the bias current values at the push part and the pull part. As a result, the current consumption can be lowered. Therefore, the embodiment can satisfy both of lowering of the power consumption and the slew rate characteristic in a trade-off relationship to each other required to a buffer circuit.

The embodiment provides predetermined offset voltages to the differential amplifier circuits with the input voltage Vin of the input terminal 'in' and the output voltage Vout from the output terminal 'out' as input. That is for the purpose of lowering the current consumption. If a buffer circuit that puts much weight on the slew rate characteristic is desired, it is effective to reduce the offset voltages of the differential amplifier circuits to zero.

Although the embodiment sets predetermined offset voltages by the ratio of the number of elements of two differential transistors that are input of the differential amplifier circuit as shown in FIG. 4, the present invention is not limited to the configuration. For example, a method of setting the offset voltage by a ratio of an element dimension of two differential transistors or a method of setting the offset voltage by inserting a resistor in a source terminal of one of the two differential transistors can be used.

Also a method for setting the offset voltage by combination of a plurality of the abovementioned methods can be considered. It is a matter of course that any method can be used if only it can set the offset voltage.

Although the current mirror circuit is used as a method for setting current that is additionally supplied to the bias current value at the push part and the pull part when the input voltage Vin of the input terminal 'in' abruptly transits as shown in FIG. 4, the present invention is not limited to the circuitry. Any circuit can be used in the present invention if only it can amplify the current value and additionally supply bias current to the push part and the pull part when the input voltage Vin of the input terminal 'in' abruptly transits.

Examples in which the MOS field-effect transistors form a circuit as mentioned above have been described, but the present invention is not limited to the circuitry only including the MOS field-effect transistors. For example, a circuit may be formed by bipolar transistors or any combination of the MOS field-effect transistors and the bipolar transistors.

As mentioned above, the present invention can satisfy both of lowering of the power consumption and the slew rate characteristic in a trade-off relationship to each other required to a buffer circuit.

The abovementioned embodiments only show specific examples to implement the present invention and should not be construed to limit a technical range of the present invention. That is, the present invention can be embodied in various forms without departing from its spirit and main features.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-286263, filed Oct. 20, 2006, which is hereby incorporated by reference herein in its entirety.

What is claimed is:

1. A buffer circuit having an input terminal for inputting an input signal, and an output terminal for outputting an output signal based on the input signal comprising:

an output circuit having first and second output transistors for outputting the output signal from the output terminal;

a first voltage difference detection circuit for detecting a voltage difference between the input signal and the output signal;

a second voltage difference detection circuit for detecting a voltage difference between the input signal and the output signal, wherein the second voltage difference detection circuit inputs the input signal and the output signal in a polarity opposite to a polarity of the input signal and the output signal which the first voltage difference detection circuit inputs;

a first driving circuit for increasing a bias current to be supplied to the first output transistor based on an output signal from the first voltage difference detection circuit; and a second driving circuit for increasing the bias current to be supplied to the second output transistor based on an output signal from the second voltage difference detection circuit, wherein the first and second voltage difference detection circuits are provided with predetermined input offset voltages, the first and second driving circuits supply a first bias current to the first and second output transistors when the voltage difference between the input signal and the output signal is not larger than the predetermined input offset voltages of the first and second voltage difference detection circuits, and the first and second driving circuits supply a bias current in combination with an additional bias current to the first and second output transistors when the voltage difference between the input signal and the output signal is larger than the predetermined input offset voltages of the first and second voltage difference detection circuits.

2. The buffer circuit according to claim 1, wherein each of the first and second voltage difference detection circuits has an input section including paired groups of differential transistors, and the predetermined input offset voltages of the first and second voltage difference detection circuits are set by adjusting a ratio of a number of the differential transistors included in one of the paired groups to a number of the differential transistors included in the other of the paired groups; or by adjusting a ratio of an element dimension of the differential transistor included in one of the paired groups to an element dimension of the differential transistor included in the other of the paired groups; or by inserting a resistor in a main electrode terminal of the differential transistor included in one of the paired groups.

* * * * *